US009496294B2

(12) United States Patent
Shen

(10) Patent No.: US 9,496,294 B2
(45) Date of Patent: Nov. 15, 2016

(54) ARRAY SUBSTRATE, MANUFACTURING METHOD AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Qiyu Shen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 231 days.

(21) Appl. No.: 14/388,122

(22) PCT Filed: Dec. 12, 2013

(86) PCT No.: PCT/CN2013/089152

§ 371 (c)(1),
(2) Date: Sep. 25, 2014

(87) PCT Pub. No.: WO2015/014070

PCT Pub. Date: Feb. 5, 2015

(65) Prior Publication Data

US 2016/0260753 A1 Sep. 8, 2016

(30) Foreign Application Priority Data

Jul. 31, 2013 (CN) .......................... 2013 1 0329856

(51) Int. Cl.

*H01L 21/00* (2006.01)
*H01L 21/84* (2006.01)
*H01L 27/12* (2006.01)
*H01L 29/786* (2006.01)
*G02F 1/1368* (2006.01)

(52) U.S. Cl.

CPC ......... *H01L 27/1285* (2013.01); *G02F 1/1368* (2013.01); *H01L 27/1222* (2013.01); *H01L 27/1288* (2013.01); *H01L 29/78675* (2013.01)

(58) Field of Classification Search

CPC ........... H01L 27/1288; H01L 27/1214; H01L 29/78621; H01L 29/42368; H01L 29/66757

See application file for complete search history.

(56) References Cited

U.S. PATENT DOCUMENTS 5,688,409 A * 11/1997 Dao .......................... G03F 1/26 216/48
6,348,289 B1 * 2/2002 Couteau ................ B25J 9/1664 257/E21.206

(Continued)

FOREIGN PATENT DOCUMENTS

| | | | |
|---|---|---|---|
| CN | 1296643 | A | 5/2001 |
| CN | 1722389 | A | 1/2006 |
| CN | 101075586 | A | 11/2007 |
| CN | 101572218 | A | 11/2009 |
| CN | 102012631 | A | 4/2011 |
| CN | 103413783 | A | 11/2013 |

OTHER PUBLICATIONS

International Search Report mailed May 13, 2014; PCT/CN2013/089152.

(Continued)

*Primary Examiner* — Zandra Smith
*Assistant Examiner* — John M Parker
(74) *Attorney, Agent, or Firm* — Ladas & Parry LLP

(57) ABSTRACT

A method for manufacturing an array substrate comprising: using a mask plate (4), and controlling exposure energy to obtain a first exposure feature size, so as to form a gate metal layer on the array substrate; and using the mask plate again, and controlling exposure energy to obtain a second exposure feature size larger than a size of the gate metal layer, so as to form low doped regions (8) located at opposite sides of the gate metal layer and having a same length. The method can form the two low doped regions of the LTPS-TFT having the same length and guarantee the ability of the LTPS-TFT to suppress the leakage current.

4 Claims, 3 Drawing Sheets

4
D2
8
7

(56) References Cited

U.S. PATENT DOCUMENTS

| | | | | |
|---|---|---|---|---|
| 2002/0068392 | A1 | 6/2002 | Lee et al. | |
| 2004/0063038 | A1* | 4/2004 | Shin .................... | G03F 7/70441 430/311 |
| 2004/0089878 | A1 | 5/2004 | Takehashi et al. | |
| 2006/0008955 | A1 | 1/2006 | Sera et al. | |
| 2009/0224258 | A1 | 9/2009 | Que et al. | |

OTHER PUBLICATIONS

First Chinese Office Action dated Nov. 18, 2014; Appln. No. 201310329856.9.

International Preliminary Report on Patentability issued Feb. 2, 2016; PCT/CN2013/089152.

Chinese Patent Certificate dated Feb. 24, 2014; ZL 2013 1 0329856.9.

Second Chinese Office Action dated Apr. 14, 2015; Appln. No. 201310329856.9.

Third Chinese Office Action dated Sep. 24, 2015; Appln. No. 201310329856.9.

Chinese Notice of Allowance dated Jan. 20, 2016; Appln. No. 201310329856.9.

Written Opinion of the International Searching Authority mailed May 13, 2014; PCT/CN2013/089152.

* cited by examiner

ARRAY SUBSTRATE, MANUFACTURING METHOD AND DISPLAY DEVICE

CROSS REFERENCE TO RELATED APPLICATIONS

This application is based on International Application No. PCT/CN2013/089152 filed on Dec. 12, 2013, which claims priority to Chinese National Application No. 201310329856.9 filed on Jul. 31, 2013. The entire contents of each and every foregoing application are incorporated herein by reference.

TECHNICAL FIELD

The embodiments of the present invention relate to an array substrate, a manufacturing method, and a display device.

BACKGROUND

During preparing a low temperature poly-silicon (LTPS) thin film transistor liquid crystal display (TFT-LCD), an excimer laser, used as a heat source, is projected onto an amorphous silicon structure prepared on a glass substrate. The amorphous silicon structure, after absorbing the energy of the excimer laser, is turned into a poly-silicon structure. Since the whole crystallization process is carried out below 600 centigrade, the process is referred to as low temperature process, and is suitable to most glass substrates.

The LTPS-TFT LCD is widely applied due to the advantages such as its high resolution, quick response, high brightness, high aperture ratio, and so on. However, in the conventional array substrate, it is necessary to use two mask plates to perform the photolithography process to form the gate electrode and the low doped region of a TFT, and therefore, after completing the gate electrode, the mask plate in the photolithography apparatus is changed to another one to form the low doped region. There may be some misalignment between the two mask plates and causing that the two low doped regions, which should be symmetrically located at the opposite sides of the gate electrode, has different length. Such low doped regions having different length reduces the ability of the TFT to suppress the leakage current, causes large leakage current, and thus increases the power consumption of the LTPS-TFT LCD.

SUMMARY

The embodiments of the present invention provide an array substrate, a manufacturing method, and a display device enabled the two low doped regions of the LTPS-TFT to have the identical length and guarantee the ability of the LTPS-TFT to suppress the leakage current.

The first aspect of the present invention provides a manufacturing method for an array substrate, the method comprises: forming a gate metal layer on the array substrate by using a mask plate; and obtaining a second exposure feature size larger than the size of the gate metal layer by using the mask plate and controlling exposure energy, to form low doped regions located at opposite sides of the gate metal layer and having a same length.

In the method, for example, the length of the low doped regions is 1 to 2 micrometers.

In the method, for example, before forming the gate metal layer on the array substrate, the method further comprises: forming a first insulation layer on the substrate; forming an amorphous silicon layer on the first insulation layer, and forming an poly-silicon layer by performing laser-annealing process; and forming silicon islands of the poly-silicon layer by a first patterning process.

In the method, for example, after forming the gate metal layer on the array substrate, the method further comprises performing laser-annealing process on the silicon islands.

In the method, for example, forming the low doped regions located at opposite sides of the gate metal layer and having a same length comprises: obtaining the second exposure feature size larger than the size of the gate metal layer by using the mask plate and controlling exposure energy, for forming to-be-doped regions located at the opposite sides of the gate metal layer and having the same length; and performing an ion doping process on the to-be-doped regions to form the low doped regions.

The second aspect of the present invention provides an array substrate comprising a gate metal layer and low doped regions located at opposite sides of the gate metal layer and having a same length.

For example, the length of the low doped regions is 1 to 2 micrometers.

The third aspect of the present invention provides a display device comprising the array substrate as above described.

DESCRIPTION OF DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
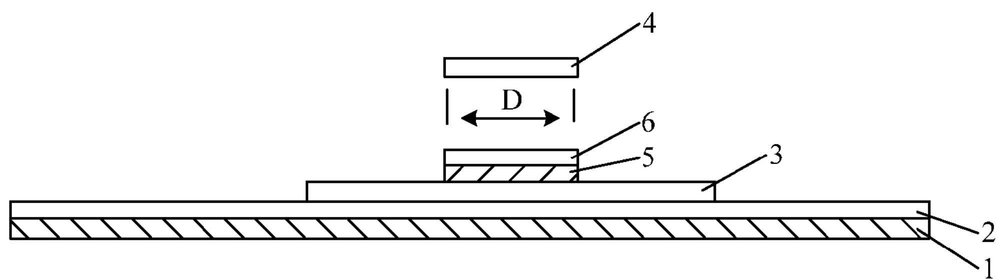
FIG. 1 is a first structural schematic view showing the array substrate according to an embodiment of the present invention.

| Description of the Reference Numerals | | |
|---|---|---|
| 1. Substrate | 2. First insulation layer | 3. Silicon Island |
| 4. Mask plate | 5. Gate insulation layer | 6. Gate metal layer |
| 7. Photoresist | 8. Low doped region | 9. Third insulation layer |
| 10. First via | 11. Second via | 12. Source electrode |

-continued

| Description of the Reference Numerals | | |
|---|---|---|
| 13. Drain electrode | 14. Resin layer | 15. Third via |
| 16. Pixel electrode | 17. Protection layer | 18. Common electrode |

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

An embodiment of the present invention provides a manufacturing method for an array substrate, and the method comprises the following steps:

Step S101, using a mask plate and controlling exposure energy to obtain a first exposure feature size, to form a gate metal layer on an array substrate;

Step S102, using the mask plate again, and controlling exposure energy to obtain a second exposure feature size larger than a size of the gate metal layer, to form low doped regions located at opposite sides of the gate metal layer and having a same length.

In the present disclosure, "exposure feature size" means the size of the region formed by using an exposure process. The gate metal layer comprises the gate electrode of the thin film transistor and the gate line connected to the gate electrode. Therefore, in the step S101, the obtained first exposure feature size corresponds to the size of the gate electrode and the gate line. For the sake of convenience, the first exposure feature size, the second exposure size and the size of the gate metal layer all refer to the size at the corresponding particular locations in a widthwise direction of the gate electrode or the gate line.

In the technical solution of the present embodiment, after forming the gate metal layer, by using the mask plate for forming the gate metal layer again, and by controlling the exposure energy, a second exposure feature size larger than the size of the gate metal layer is obtained, to form the low doped regions located at opposite sides of the gate metal layer and having a same length. It is possible to prevent the occurrence of the alignment error incurred by changing the mask plate, guarantee the same length of the low doped regions and the ability of the prepared LTPS-TFT to suppress the leakage current, and thus reduce the leakage current and lower down the power consuming of the LTPS-TFT LCD.

Herein, the operation principle of the embodiment of the present invention will be explained with reference to FIG. 8A to FIG. 8C. During exposure process by using a mask plate, the luminous intensity at the edge portions of the light beam is determined by the amount of the exposure energy.

Figure 8A:
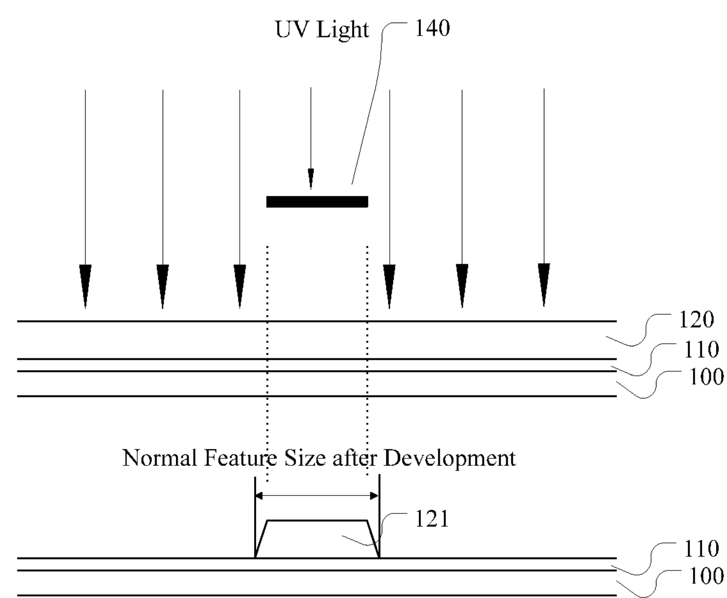
FIG. 8A to FIG. 8C are the schematic views for explaining the operation principle of an embodiments of the present invention.

FIG. 8A shows the case where the photoresist layer 120 on the array substrate 100 is exposed and developed with moderate exposure energy by using a mask plate 140. For example, the light source used by the exposure process is UV light source, and positive photoresist is used. The photoresist 120, for example, is applied on the structure layer 110 to be patterned, and the photoresist pattern 121 having a desirable normal feature size is obtained by developing the exposed photoresist layer 110.

Figure 8B:
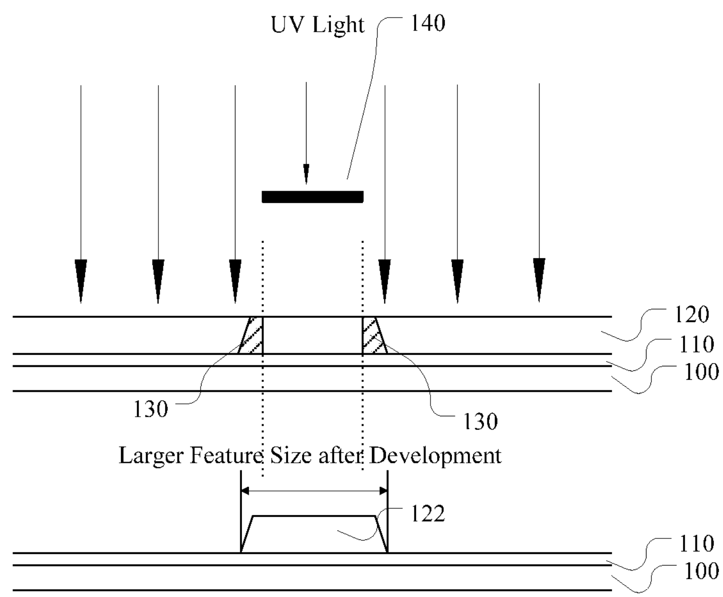

FIG. 8B shows the case where the photoresist layer 120 on the array substrate 100 is exposed and developed with relative low exposure energy by using the mask plate 140. Compared with the case as illustrated in FIG. 8A, since the light energy absorbed by the photoresist at the position corresponding to the edge portions of the mask plate 140 is smaller, an incompletely photoreacted region 130 is obtained in the region which should be fully exposed; after development, due to the presence of the incompletely photoreacted region 130, the feature size of the photoresist pattern 122 obtained by development is relatively large, and larger than the size of the normal photoresist pattern 121 as illustrated in FIG. 8A.

Figure 8C:
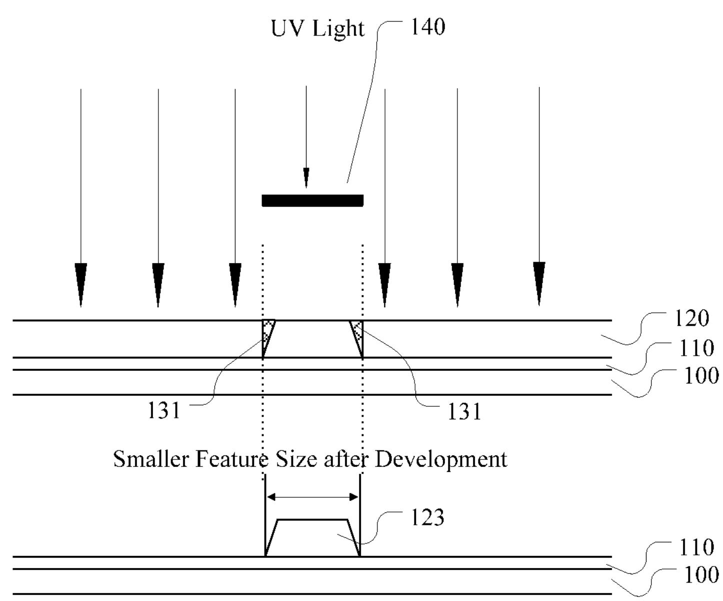

FIG. 8C shows the case where the photoresist layer 120 on the array substrate 100 is exposed and developed with relative high exposure energy by using the mask plate 140. Compared with the case as illustrated in FIG. 8A, since the light energy absorbed by the photoresist at the position corresponding to the edge portion of the mask plate 140 is larger, a photoreacted region 131 is obtained in the region which should not be exposed; after development, due to the presence of the photoreacted region 130, the feature size of the photoresist pattern 123 obtained by development is relatively small, and smaller than the size of the normal photoresist pattern 121 as illustrated in FIG. 8A.

It is noted that for the three situations as illustrated in FIG. 8A to FIG. 8C, the process parameters other than the exposure energy are kept constant. In the embodiment of the present invention, the situation as illustrated in FIG. 8C is mainly employed. The situation by using negative photoresist is just opposite to the above described situation, that is, the portion of the photoresist illuminated by the light is remained after development, and the portion of the photoresist which is not illuminated by the light is removed after development, it will not be further described here.

Based on the above embodiment, another embodiment of the present invention provides a manufacturing method for an array substrate, the method comprises the following steps, but the scope of the present invention will not be limited to the situation as particularly illustrated here.

Step S201, forming a first insulation layer on the substrate.

As illustrated in FIG. 1, a first insulation layer 2 is formed on the substrate 1. In the embodiment of the present invention, the first insulation layer 2 may be in a multi-layer structure. For example, the first insulation layer 2 comprises two layers, which respectively are a layer of silicon nitride (SiNx) and a layer of silicon oxide (SiO2) from bottom to top.

The layer of SiNx has a high breakdown voltage character, has self-hydrogenization repair ability, however, is likely suffered from the bad phenomenon such as carrier capture defects and threshold voltage drifting due to much defects and traps existing at its interface with poly-silicon. Therefore, a layer of SiO2 is necessary to be deposited on the SiNx layer. The SiO2 layer can provide good matching relationship with the interface of a poly-silicon layer, and thus improve the mobility ratio of the poly-silicon material, guarantee the high response rate of the LTPS-TFT. For example, a thickness of the SiNx may be from 30 to 50 nanometers, and a thickness of the SiO2 layer may be from 100 to 120 nanometers.

Step S202, forming a layer of amorphous silicon on the first insulation layer, and forming a poly-silicon layer by a laser-annealing process.

In the embodiment of the present invention, the amorphous silicon layer may be formed by deposition, and the amorphous silicon may have, for example, any thickness within the range from 180 to 220 nanometers.

Before performing the laser-annealing process, the amorphous silicon layer may be subject to a dehydrogenation process to lower down the content of hydrogen in the amorphous silicon layer to about 2%, to prevent the occurrence of hydrogen explosion. The laser-annealing process may employ many options, for example, excimer laser crystallization (ELA), metal-induced lateral crystallization, and so on.

Step S203, forming silicon islands of the poly-silicon layer by a first patterning process.

After forming the poly-silicon layer, silicon islands 3, which are spaced from each other and each of which corresponds to one LTPS-TFT, are formed by a first patterning process comprising a photolithography process and an etching process.

Step S204, performing ion doping on the silicon islands. For example, boron ions are used to dope the silicon islands.

In the case that the conductive channel of the LTPS-TFT is a P-type channel, the dose of the boron ions to be doped is controlled when performing doping on the silicon islands, to form the P-type LTPS-TFT channel.

In the case that the conductive channel of the LTPS-TFT is an N-type channel, after doping a part of a silicon island with the boron ions, the remaining area of the silicon island which is not doped with boron ions is doped with phosphorus ions, to form the N-type LTPS-TFT channel.

Step S205, forming a second insulation layer and a first metal layer on the silicon islands.

Similar to the first insulation layer, the second insulation layer may also be in a multi-layer structure, and for example, comprises a $SiO_2$ layer with the thickness of 30 to 50 nm and a SiNx layer with the thickness of 100 to 120 nm from bottom to top. The underlying $SiO_2$ layer is configured for forming a good interface matching with the silicon islands 3, and the SiNx layer can function to prevent the LTPS-TFT from being electrically broken down. For example, the thickness of the first metal layer may be 200 to 300 nanometers, and may be formed by metal such as aluminum, molybdenum, copper, etc. and alloy thereof.

Furthermore, the embodiment of the present invention may further comprise:

Step S101, Using a mask plate, and controlling exposure energy to obtain a first exposure feature size, to form a gate metal layer on the array substrate.

In the embodiment of the present invention, an example of the Step S101 comprises: forming photoresist, which is positive photoresist or negative photoresist, on the array substrate by coating or the like, etching the second insulation layer and the first metal layer respectively to form a gate insulation layer 5 and a gate metal layer 6 by using a mask plate 4 and by a second patterning process. Here, the gate metal layer 6 as illustrated in FIG. 1 corresponds to the gate electrode of the thin film transistor.

The surplus portions of the second insulation layer and the first metal layer are removed through the second patterning process comprising a photolithography process and an etching process by using the mask plate 4, and the remaining portions of the second insulation layer and the first metal layer are respectively formed as a gate insulation layer 5 and a gate metal layer 6. When the photoresist is exposed during the photolithography process, the exposure energy is controlled to obtain the first exposure feature size, and thus obtain the corresponding photoresist pattern. After etching, the gate metal layer corresponding to the photoresist pattern is obtained. At this time, the first exposure feature size, for example, is equal to the width D of the gate metal layer (i.e. the width D of the gate electrode).

While the gate metal layer is formed through the second patterning process, a gate line is also formed on the array substrate with the first metal layer.

As above, after the steps S201 to S101, the array substrate as illustrated in FIG. 1 is obtained.

Step S206, forming photoresist on the substrate.

Figure 2:
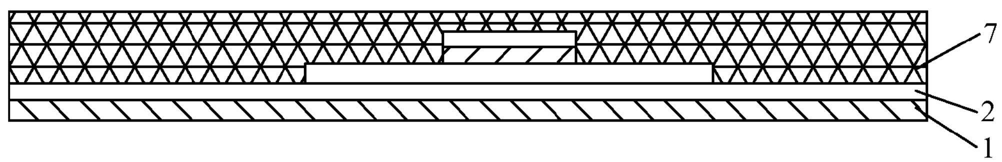
FIG. 2 is a second structural schematic view showing the array substrate according to an embodiment of the present invention.

In the embodiment of the present invention, the photoresist 7 may be formed on the substrate by coating or the like, and the photoresist 7 may be negative photoresist or positive photoresist. If the photoresist for forming the gate metal layer 6 is positive photoresist, then the photoresist used here should be negative photoresist. Or, if the photoresist for forming the gate metal layer 6 is negative photoresist, then the photoresist to be used here should be positive photoresist. The reason for selecting the kinds of photoresist is to use the mask plate 4 that has been used in forming the gate metal layer 6. Hereinafter, the negative photoresist will be described as an example and the structure of the array substrate at this time is illustrated in FIG. 2.

Step S102, using the mask plate, and controlling the exposure energy to obtain a second exposure feature size larger than a size of the gate metal layer, so as to form low doped regions located at opposite sides of the gate metal layer and having a same length.

In the case that the first exposure feature size corresponds to the width of the gate metal layer 6, the second exposure feature size is also larger than the first exposure feature size at the corresponding position.

As above described with reference to FIG. 8A to FIG. 8C, upon exposure, the used mask plate will form a symmetrical shade region on the photoresist, and the shade region is the region sheltered by the mask plate as well-known, and will not be exposed. Since the light for exposure will be scattered or diffuses in the air, and together with the shelter effect of the mask plate, there will exists a certain transition region formed between the shade region and the exposure region which is fully illuminated by the exposure light, and the transition region will receive relatively low exposure energy. The size of the shade region may be adjusted by adjusting the distance from the exposure apparatus to the mask plate or by adjusting the exposure intensity.

Further, since the chemical reaction is occurred, only if the photoresist absorbs enough energy, to form a portion insoluble in the development liquid, by appropriately reducing the exposure energy, the exposure energy received by the transition region is relative small, insufficient to enable the negative photoresist in the transition region to fully react, so that the negative photoresist in the transition region can still be developed by the development liquid, so that a pattern region slightly larger than the mask plate is formed in the negative photoresist.

As illustrated in FIG. 3, by using again the mask plate 4 that has been used to form the pattern of the gate metal layer, on the premise that the negative photoresist can be fully reacted in the thickness direction, the exposure energy can be slightly lowered, so that the exposed feature has a size D2 larger than the size D of the gate metal layer 6, and then after development, the photoresist pattern obtained by the remaining photoresist will uncover part of the region at the opposite sides of the gate metal layer 6, and accordingly, the to-be-doped regions located at the opposite sides of the gate metal layer 6 and having the same length can be obtained, and the to-be-doped regions are formed by the gate metal layer 6 and the remaining photoresist 7 together.

Furthermore, since the etching error of negative photoresist is larger than the etching error of positive photoresist, in forming of the to-be-doped regions, the negative photoresist is preferred so as to form the to-be-doped regions by using the mask plate 4 for forming the gate metal layer 6. Accordingly, when the gate metal layer 6 is formed, the positive photoresist is preferred.

Then, an ion doping process is performed upon the to-be-doped regions to form the low doped regions.

Figure 3:
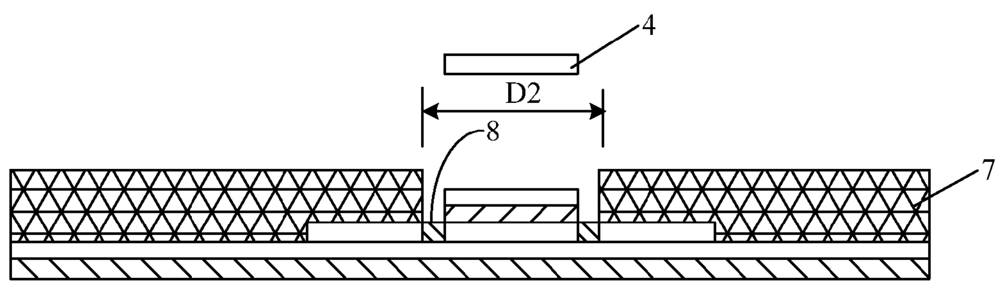
FIG. 3 is a third structural schematic view showing the array substrate according to an embodiment of the present invention.

From the step S206, it can be seen that the used photoresist 7 is negative photoresist, and when an exposing process is performed, the photoresist 7 within the exposure feature size can be removed by solving in the development liquid because it is not subjected to exposure, so that the gate metal layer 6 and the to-be-doped regions are exposed outside, as illustrated in FIG. 3.

Then the photoresist 7, which is not removed because it is not exposed, and the gate metal layer 6 are used as a mask, the to-be-doped regions are doped with N+ ions (for example, phosphorus ions) to form the low doped regions 8.

Since the resistance value of the low doped regions 8 is large, the ON-state current and the state current of the LTPS-TFT will be influenced if the length of the low doped regions 8 is too long or too short. In particular, the low doped regions with a too long length will reduce the ON-state current of the LTPS-TFT, and thus reduce the response rate of the LTPS-TFT, while the low doped regions with too short length will increase the leakage current. Therefore, the length of the low doped regions 8 should be limited in a suitable range. In the embodiment of the present invention, the length of the low doped regions 8 is limited to 1 to 2 micrometers.

After completion of the ion doping process, the exposed photoresist which is insoluble in the development liquid is removed by a photoresist peeling off process.

Step S207, forming the third insulation layer, performing a third patterning process upon the third insulation layer to form the patterns of a first via and a second via which are located symmetrically at the opposite sides of the gate metal layer.

Figure 4:
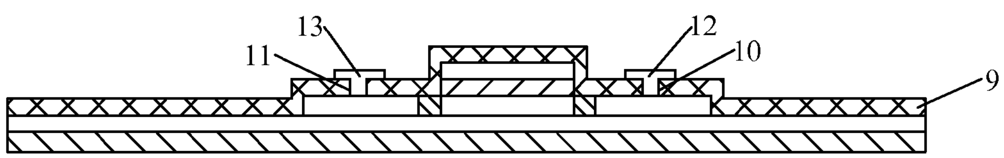
FIG. 4 is a fourth structural schematic view showing the array substrate according to an embodiments of the present invention.

The first via 10 and the second via 20 are illustrated in FIG. 4.

Preferred, the third insulation layer 9 may have a multi-layer structure, and comprises a SiO2 layer with a thickness of 30 to 50 nm, and a SiNx layer with a thickness of 100 to 120 nm from below to top.

Step S208, forming a second metal layer, and forming patterns comprising a source electrode and a drain electrode by a fourth patterning process.

The second metal layer may be formed by sputtering, depositing, or the like. While the source electrode and the drain electrode are formed as illustrated in FIG. 4 by the fourth patterning process, a data line is also formed on the array substrate.

In the embodiment of the present invention, the second metal layer may be formed from a metal such as molybdenum, aluminum, neodymium, copper, or the like and any alloy thereof.

Step S209, depositing a resin layer, and forming a pattern comprising a third via located in the drain electrode region by a fifth patterning process.

The material for the resin layer 14 may be photosensitive resin or non-photosensitive resin.

Step S210, forming a first transparent conductive film, and forming a pixel electrode connected with the drain electrode through the third via by a sixth patterning process.

For example, the first transparent conductive film may be formed by sputtering or the like.

Figure 5:
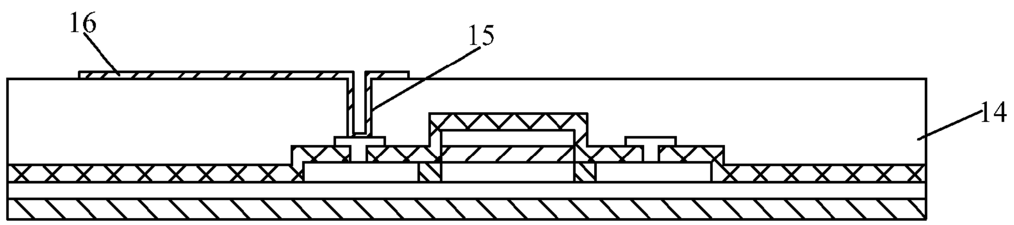
FIG. 5 is a fifth structural schematic view showing the array substrate according to an embodiment of the present invention.

After completion of the step S210, the structure of the array substrate as illustrated in FIG. 5 is formed. As illustrated in FIG. 5, the pixel electrode 16 is electrically connected with the drain electrode 13 through the third via 15 in the resin layer 14.

Step S211, forming a protection layer.

Figure 6:
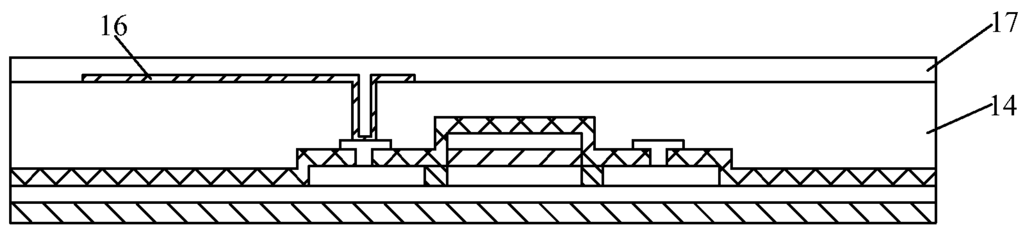
FIG. 6 is the sixth structural schematic view showing the array substrate according to an embodiment of the present invention.

After completion of the Step S211, the structure of the array substrate as illustrated in FIG. 6 is formed.

The material for the protection layer 17 may be resin, and in particular, may be photosensitive resin or non-photosensitive resin.

Step S212, forming a second transparent conductive film, and forming a pattern comprising a common electrode by a seventh patterning process.

Figure 7:
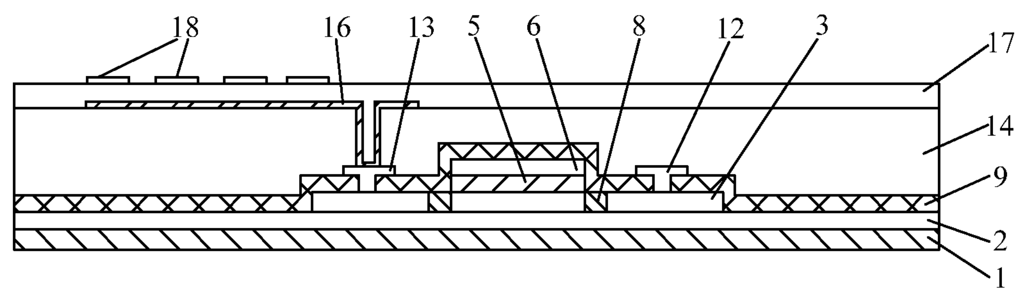
FIG. 7 is a seventh structural schematic view showing the array substrate according to an embodiment of the present invention.

As illustrated in FIG. 7, there is formed a common electrode 18, as a slit electrode, in one pixel region on the array substrate, and the common electrodes 18 each are spaced from each other by a certain distance.

As above, after the steps as illustrated in FIG. 2, the array substrate as illustrated in FIG. 7 can be manufactured.

It is to be noted that in the case that the uniformity of the crystal nucleus of the poly-silicon layer formed after the Step S202 can not meet the expected requirements, another laser annealing process may be performed upon the poly-silicon layer again.

In addition, another laser annealing process may be performed after the step S102.

It is preferred that the number of the laser annealing processes is limited to two, this is because when the times of the laser annealing process are larger than two, the possibility of occurrence of hydrogen explosion will greatly increased, even though the dehydrogenation process has been performed, In addition, the cost for manufacturing the LTPS-TFT is also increased.

Furthermore, as illustrated in FIG. 7, the embodiment of the present invention further provides an array substrate formed by the manufacturing method for the array substrate as above described. The array substrate comprises a gate metal layer 6 and low doped regions located at opposite sides of the gate metal layer and having a same length; and the length of the low doped regions is 1 to 2 micrometers.

The array substrate according to the embodiment of the present invention comprises a plurality of gate lines and a plurality of data lines, and these gate lines and data lines are intersected to define pixel units arranged in a matrix, each of the pixel units comprises a thin film transistor as a switch member. For example, the thin film transistor of each of the pixel units is the LTPS-TFT obtained by the above-described method.

Furthermore, the embodiment of the present invention further provides a display device, and the display device, for example, may be a liquid panel, an electronic paper, an OLED panel, a mobile phone, a tablet computer, a television, a display, a notebook computer, a digital picture frame, a navigator, and any other products or components having display function.

One example of the display device is a liquid crystal display device, and an array substrate is arranged oppositely to an opposing substrate to form a liquid crystal cell in which liquid crystal material is filled. The opposing substrate, for example, is a color filter substrate. In some examples, the liquid crystal display device further comprises a backlight source for provide light to the array substrate.

Another example of the display device is an organic light emitting diode (OLED) display device; an organic light emitting material stack is formed on the array substrate, and the pixel electrode of each of the pixel units is used as a anode or a cathode to drive the organic light emitting material to emit light, to perform display operation.

What are described above is related to the illustrative embodiments of the disclosure only and not limitative to the scope of the disclosure.

The invention claimed is:

1. A method for manufacturing an array substrate, comprising:

forming a first insulation layer on the array substrate;

forming an amorphous silicon layer on the first insulation layer, and performing a laser annealing process to form a poly-silicon layer;

forming silicon islands of the poly-silicon layer by a first patterning process;

using a mask plate to form a gate metal layer on the array substrate; and using the mask plate again, and controlling exposure energy to obtain a exposure feature size larger than a size of the gate metal layer, so as to form low doped regions located at opposite sides of the gate metal layer and having a same length in the silicon islands.

2. The method as claimed in claim 1, wherein a length of the low doped regions are 1 to 2 micrometers.

3. The method as claimed in claim 1, after forming the gate metal layer on the array substrate, further comprising:

performing a laser annealing process on the silicon islands.

4. The method as claimed in claim 3, wherein forming the low doped regions located at opposite sides of the gate metal layer and having a same length comprises:

using the mask plate again, and controlling exposure energy to obtain the exposure feature size larger than the size of the gate metal layer, so as to form to-be-doped regions located at the opposite sides of the gate metal layer and having the same length; and performing an ion doping process on the to-be-doped regions to form the low doped regions.

* * * * *